(12) United States Patent
Clara et al.

(10) Patent No.: US 7,642,877 B2
(45) Date of Patent: Jan. 5, 2010

(54) SELF-OSCILLATING MODULATOR AND METHOD FOR ADJUSTING A SELF-OSCILLATING MODULATOR

(75) Inventors: Martin Clara, Villach (AT); Thomas Poetscher, Villach (AT); Sergio Walter, Villach (AT); Andreas Wiesbauer, Portschach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/517,640

(22) Filed: Sep. 8, 2006

(65) Prior Publication Data
US 2007/0069933 A1 Mar. 29, 2007

(30) Foreign Application Priority Data
Sep. 23, 2005 (DE) .................. 10 2005 045 584

(51) Int. Cl.
*H03K 7/08* (2006.01)
(52) U.S. Cl. .................. 332/109; 330/10; 330/251
(58) Field of Classification Search .............. 332/109, 332/106, 110; 330/10, 251
See application file for complete search history.

(56) References Cited

U.S. PATENT DOCUMENTS

| | | | |
|---|---|---|---|
| 4,531,096 A * | 7/1985 | Yokoyama | 330/10 |
| 4,591,810 A | 5/1986 | Mackenzie et al. | |
| 4,952,884 A * | 8/1990 | Tokumo et al. | 330/10 |
| 5,451,900 A * | 9/1995 | Haga et al. | 330/10 |
| 5,910,743 A | 6/1999 | Baskin | |
| 6,016,075 A * | 1/2000 | Hamo | 330/10 |
| 6,351,184 B1 * | 2/2002 | Miao et al. | 330/207 A |
| 6,489,841 B2 * | 12/2002 | Takagishi | 330/10 |
| 6,778,011 B2 * | 8/2004 | Noro et al. | 330/10 |
| 7,075,803 B2 * | 7/2006 | Eberlein | 363/41 |
| 7,183,840 B2 * | 2/2007 | Maejima | 330/10 |
| 2007/0069814 A1 * | 3/2007 | Giotta et al. | 330/251 |

FOREIGN PATENT DOCUMENTS

JP        05152867        6/1993

OTHER PUBLICATIONS

German Office Action dated Jul. 4, 2006.

* cited by examiner

*Primary Examiner*—Robert Pascal
*Assistant Examiner*—Levi Gannon
(74) *Attorney, Agent, or Firm*—Jenkins, Wilson, Taylor & Hunt, P.A.

(57) ABSTRACT

A self-oscillating pulse-width modulator comprises an input, an output and a control loop. The control loop comprises a forward branch and a feedback loop. The forward branch is connected between the input and the output and comprises a comparator and a delay element. The feedback loop loops back to the input a feedback signal which depends on an output signal present at the output. The phase shift of the open control loop is 180° at the frequency of an oscillation to be generated by the modulator. At least a part of the phase shift is realized in the forward branch by means of the at least one delay element.

5 Claims, 2 Drawing Sheets

PRIOR ART

SELF-OSCILLATING MODULATOR AND METHOD FOR ADJUSTING A SELF-OSCILLATING MODULATOR

BACKGROUND OF THE INVENTION

The invention relates to a self-oscillating pulse-width modulator and a method for adjusting a self-oscillating pulse-width modulator.

A self-oscillating pulse-width modulator has the aim of generating a signal of a particular frequency. In Kikkert, C. J. et al., "Asynchronous Delta Sigma Modulation", IEEE Proceedings, Apr. 1975, pages 83 to 88, examples of self-oscillating pulse-width modulators are disclosed which are shown in FIGS. 1 and 2.

The self-oscillating modulator 1 shown in FIG. 1 has the form of a control loop and comprises an input E1, an output A1, a forward branch 2 connected between the input E1 and the output A1 and a feedback loop 3 which loops an output signal a1 present at the output A1 back to the input E1. The output signal a1 looped back is subtracted from an input signal e1 of the modulator 1, present at the input E1. The resultant difference signal w1 is supplied to the forward branch 2. The forward branch 2 comprises an integrator 4 and a comparator 5.

For the self-oscillating modulator 1 shown in FIG. 1 to oscillate by itself, the phase shift of the open control loop must be 180° at the frequency at which the modulator 1 is intended to oscillate. In the self-oscillating modulator 1 shown in FIG. 1, this is achieved by correspondingly adjusting a hysteresis of the comparator 5. A further self-oscillating pulse-width modulator comprising a comparator, the hysteresis of which is adjusted in suitable manner, is known from U.S. Pat. No. 6,297,693 B1.

The self-oscillating pulse-width modulator 21 shown in FIG. 2 also has the form of a control loop and comprises an input E2 and an output A2 between which a forward branch 22 is connected. The forward branch 22 comprises an integrator 24 followed by a comparator 25 which, however, does not have a hysteresis. The modulator 21 also comprises a feedback loop 23 which, however, comprises a delay element 26. Due to the delay element 26, an output signal a2 present at the output A2 is looped back delayed in time as signal r2 to the input E2 where it is subtracted from an input signal e2 present at the input E2. The time delay of the delay element 26 is selected in such a manner that the phase shift of the open control loop is 180° at the frequency at which the modulator 21 is intended to oscillate.

However, adjusting the hysteresis of the comparator 5 of the modulator 1 shown in FIG. 1 and adjusting the delay of the delay element 26 of the modulator 21 shown in FIG. 2 with sufficient precision is relatively difficult.

BRIEF SUMMARY OF THE INVENTION

The invention provides a self-oscillating pulse-width modulator comprising an input, an output and a control loop comprising a forward branch connected between the input and the output and comprising a feedback loop, wherein the forward branch comprises a comparator, the feedback loop loops back to the input a feedback signal which depends on the output signal present at the output, and the phase shift of the open control loop is 180° at the frequency of an oscillation to be generated by means of the modulator. At least a part of the phase shift is implemented in the forward branch by means of at least one delay element. Due to the fact that the phase shift is implemented in the forward branch by means of the at least one delay element, it is possible to use a comparator without hysteresis.

The delay element may comprise, for instance, at least one latch. If the comparator, according to a preferred embodiment of the modulator according to the invention, comprises the delay element, the inventive modulator can be constructed in a relatively simple manner.

To amplify the output signal of the comparator, the modulator may comprise a driver stage following the comparator. This driver stage may particularly comprise the delay element.

The driver stage may be a so-called current-starved inverter. A current-starved inverter is known to the skilled person, in principle, for example from Christiansen, J. "An Integrated High Resolution CMOS Timing Generator Based on an Array of Delay-Locked Loops", IEEE Journal of Solid-State Circuits, Vol. 31, No. 7, Jul. 1996, pages 952 to 957. An advantage of a current-starved inverter is that it can be used for adjusting the time delay in a relatively simple and accurate manner. As a result, the modulator according to the invention can be adjusted not only relatively quickly but also relatively precisely.

The inverter can be a differential amplifier. A current-starved inverter as differential amplifier is known to the skilled person, for example from Maneatis, J. G., "Low-Jitter Process-Independent DLL and PLL Based on Self-Biased Techniques", IEEE Journal of Solid-State Circuits, Vol. 31, No. 11, Nov. 1996, pages 1723 to 1733.

The invention also provides a method for adjusting a self-oscillating pulse-width modulator comprising an input, an output and a control loop which has a forward branch connected between the input and the output and a feedback loop, wherein the forward branch comprises a comparator with at least one downstream current-starved inverter as driver stage and the feedback loop loops back to the input a feedback signal which depends on the output signal present at the output, comprising the following method step: adjusting the comparator and/or the current-starved inverter in such a manner that the phase shift of the open control loop is 180° at the frequency of an oscillation to be generated by means of the modulator. The inverter can be, in particular, a differential amplifier.

BRIEF DESCRIPTION OF THE SEVERAL VIEWS OF THE DRAWINGS

FIG. 4 is a part of the self-oscillating pulse-width modulator shown in

FIG. 3.

DETAILED DESCRIPTION OF THE INVENTION

Figure 1:
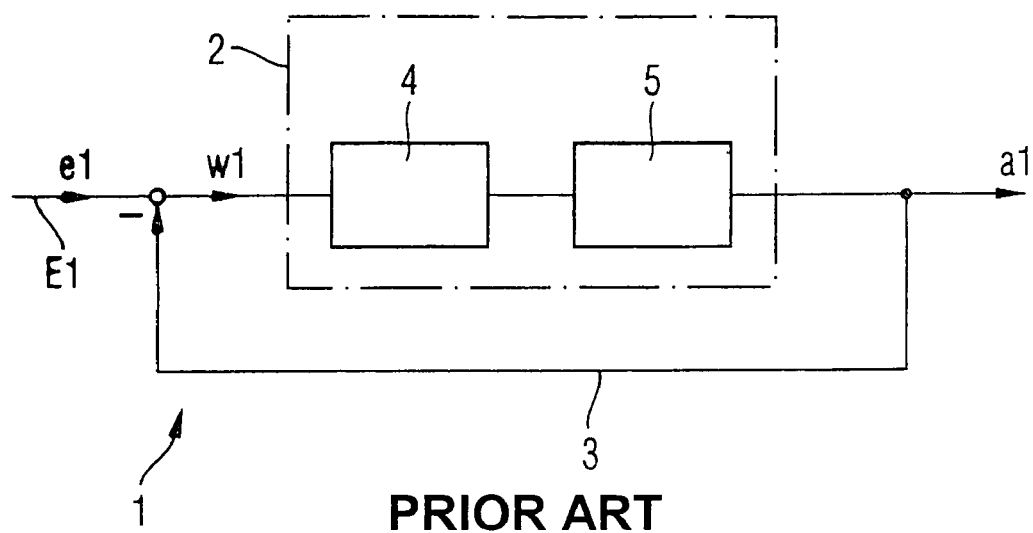
FIGS. 1 and 2, as described above, show conventional self-oscillating pulse-width modulators.
Figure 2:
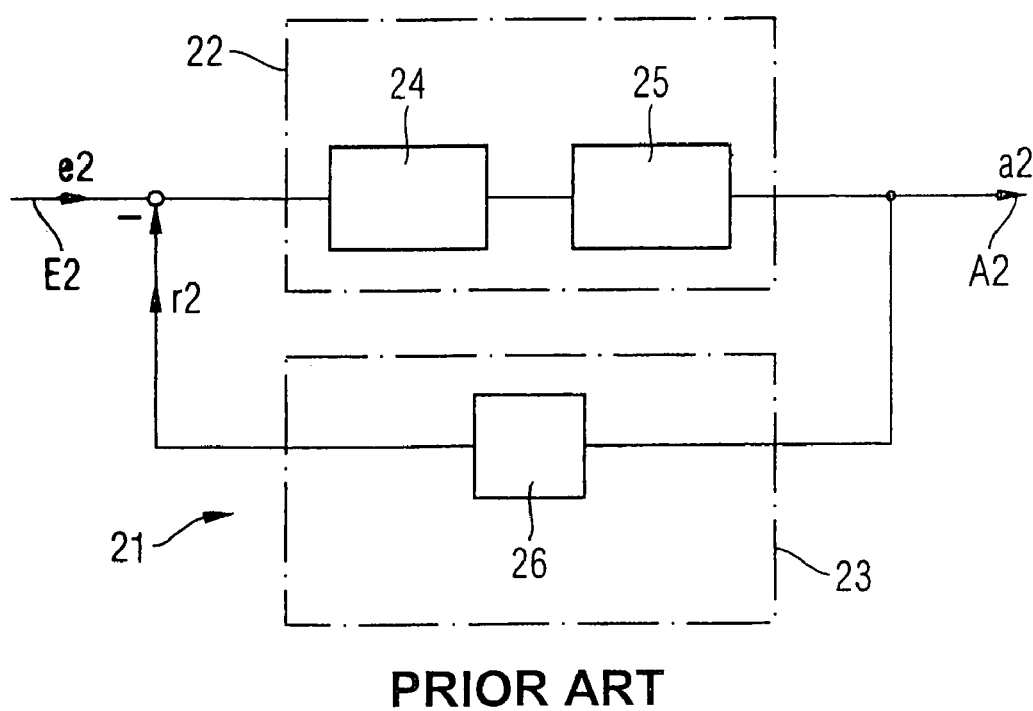
Figure 3:
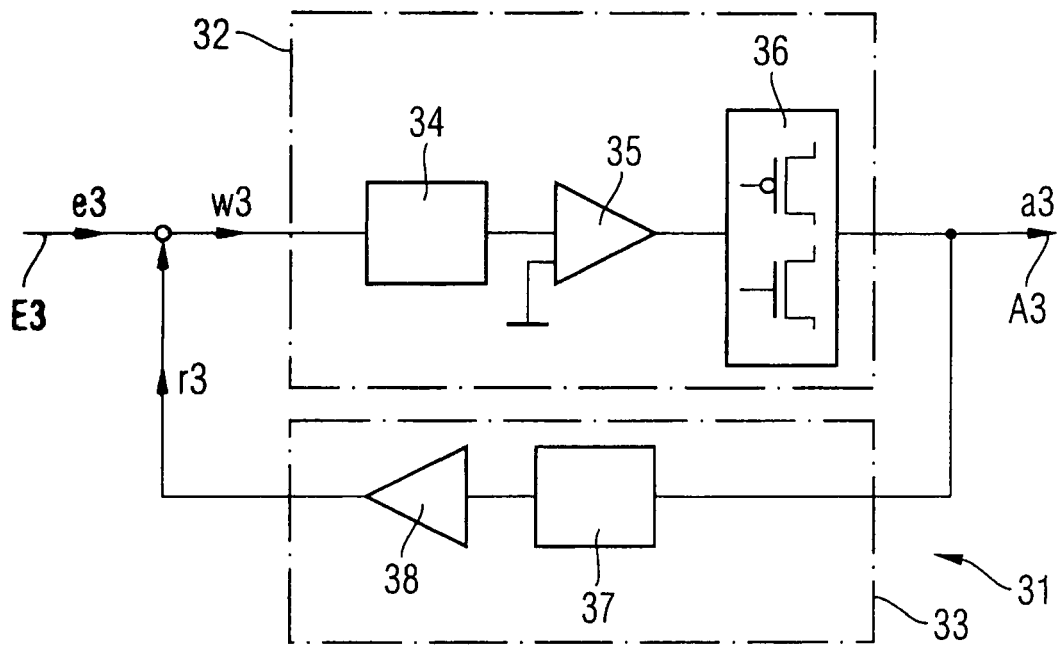
FIG. 3 is an exemplary inventive self-oscillating pulse-width modulator.

FIG. 3 shows a self-oscillating pulse-width modulator 31 comprising an input E3 and an output A3. The pulse-width modulator 31 comprises a forward branch 32, connected between the input E3 and the output A3, with a comparator 35 and a driver stage 36 following the comparator 35 and shown in greater detail in FIG. 4. The comparator 35 is chosen in such a manner that it has no hysteresis, if possible. In the case of the present illustrative embodiment, the forward branch 32 comprises a low-pass filter 34 which precedes the comparator 35 and which, among other things, allows a relatively high loop gain at low frequencies, as a result of which the linearity of the pulse-width modulator 31 can be improved. The low-pass filter 34 also produces a phase rotation in the control loop of the pulse-width modulator 31 in order to reduce a time delay.

The modulator 31 also comprises a feedback loop 33 which loops back to the input E3 of the modulator 31 a feedback signal r3 which depends on the output signal a3 of the modulator 31. The feedback signal r3 is subtracted from the input signal e3 present at the input E3 of the modulator 31. The resultant difference signal w3, in turn, is supplied to the forward branch 32 of the modulator 31.

In the case of the present illustrative embodiment, the feedback branch 33 comprises a low-pass filter 37 and an amplifier element 38 following the low-pass filter 37. The low-pass filter 37 reduces high-frequency components of the output signal a3 of the modulator 31.

Figure 4:
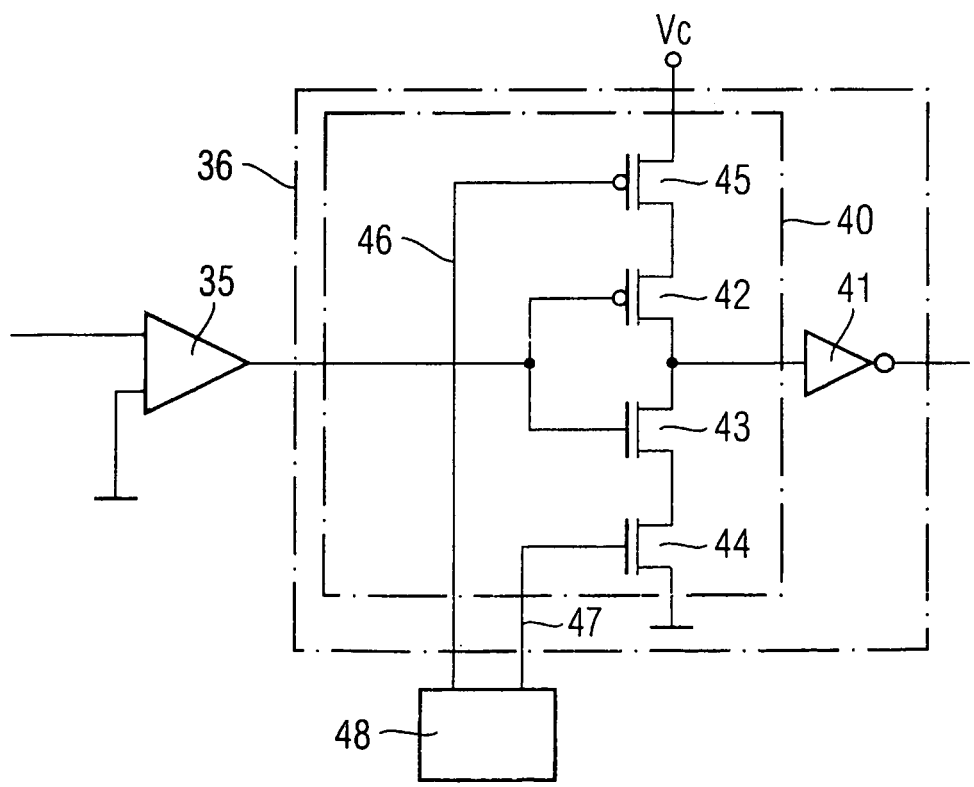

FIG. 4 shows in greater detail a part of the forward branch 32 of the modulator 31 and, in particular, the driver stage 36. The driver stage 36 comprises a so-called current-starved inverter 40 and an inverting amplifier element 41 following the current-starved inverter 40. In principle, current-starved inverters are known to the expert, for example from Christiansen, J., "An Integrated High Resolution CMOS Timing Generator Based on an Array of Delay-Locked Loops", IEEE Journal of Solid-State Circuits, Vol. 31, No. 7, Jul. 1996, pages 952 to 957. The inverter 40 which, in the case of the present illustrative embodiment, is implemented in CMOS technology, comprises two parallel-connected complementary MOSFETs 42 and 43, the gates of which are connected to one another and form the input of the inverter 40. At the input of the inverter 40, the output signal of the comparator 35 is present.

The inverter 40 comprises two further complementary MOSFETs 44 and 45, the MOSFET 45 being connected to a voltage source with positive voltage Vc and the other MOSFET 44 being connected to earth. The gates of the two MOSFETs 44 and 45 are connected to a control device 48 via electrical lines 46 and 47. The control device 48 can be used for varying the voltage present at the MOSFETs 44 and 45, as a result of which the resistances of the MOSFETs 44 and 45 can be varied. In combination with a capacitance of the downstream inverted amplifier element 41, the input signal of the inverter 40, which is also the input signal of the driver stage 36, is delayed in time, i.e. the output signal of the driver stage 36 is delayed in time relative to the input signal of the driver stage.

For the self-oscillating modulator 31 shown in FIG. 3 to oscillate by itself, the phase shift of its open control loop must be 180° at the frequency at which the modulator 31 is intended to oscillate. This phase shift is adjusted by adjusting the voltages of the two MOSFETs 44 and 45.

Although the present invention has been described by means of a preferred illustrative embodiment, the invention is not restricted to this but can be modified in many ways. In particular, it is possible for the driver stage 36 to comprise a number of cascaded inverters 40. In particular, it is also possible for the inverter 40 to be constructed as a differential amplifier. In principle, a current-starved inverter as differential amplifier is known to the expert, e.g. from Maneatis, J. G., "Low-Jitter Process-Independent DLL and PLL Based on Self-Biased Techniques", IEEE Journal of Solid-State Circuits, Vol. 31, No. 11, Nov. 1996, pages 1723 to 1733. It is also possible for the delay of the signal of the forward branch 32 to be implemented by means of the comparator 35 or for a part of this delay to be implemented by means of the comparator 35 and a part of the delay to be implemented by means of the driver stage. Further, the delay can be achieved by at least one latch circuit.

What is claimed is:

1. A self-oscillating pulse-width modulator, comprising:
   an input;
   an output; and
   a control loop comprising a forward branch and a feedback loop; the forward branch being connected between the input and the output and comprising a comparator and at least one current-starved inverter as a driver stage following the comparator, the feedback loop looping back to the input a feedback signal which depends on an output signal present at the output, and a control device for adjusting the current-starved inverter in such a manner that the phase shift of an open control loop is 180° at the frequency of an oscillation to be generated by the modulator; at least a part of the phase shift being realized in the forward branch by means of the at least one current-starved inverter.

2. The modulator of claim 1, wherein the entire phase shift is realized by means of the current-starved inverter in the forward branch.

3. The modulator of claim 1, wherein the current-starved inverter is a differential amplifier.

4. A method for adjusting a self-oscillating pulse-width modulator which is comprised of:
   an input;
   an output; and
   a control loop which comprises a forward branch and a feedback loop; the forward branch being connected between the input and the output and comprising a comparator, at least one current-starved inverter as a driver stage connected downstream of the comparator , and a control device for adjusting the current-starved inverter, and the feedback loop looping back to the input a feedback signal which depends on an output signal present at the output; the method comprising the step of:
   adjusting the current-starved inverter in such a manner that the phase shift of an open control loop is 180° at the frequency of an oscillation to be generated by the modulator.

5. The method of claim 4, wherein the current-starved inverter is a differential amplifier.

* * * * *